United States Patent
Cheng et al.

(10) Patent No.: US 9,219,114 B2
(45) Date of Patent: Dec. 22, 2015

(54) PARTIAL FIN ON OXIDE FOR IMPROVED ELECTRICAL ISOLATION OF RAISED ACTIVE REGIONS

(71) Applicant: GLOBALFOUNDRIES INC., Grand Cayman (KY)

(72) Inventors: Kangguo Cheng, Schenectady, NY (US); Eric C. Harley, Lagrangeville, NY (US); Terence B. Hook, Jericho, VT (US); Ali Khakifirooz, Mountain View, CA (US); Henry K. Utomo, Newburgh, NY (US); Reinaldo A. Vega, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 8 days.

(21) Appl. No.: 13/940,280

(22) Filed: Jul. 12, 2013

(65) Prior Publication Data
US 2015/0014773 A1 Jan. 15, 2015

(51) Int. Cl.
*H01L 29/78* (2006.01)
*H01L 29/06* (2006.01)
*H01L 29/66* (2006.01)

(52) U.S. Cl.
CPC ........ *H01L 29/0649* (2013.01); *H01L 29/6653* (2013.01); *H01L 29/66795* (2013.01); *H01L 29/785* (2013.01)

(58) Field of Classification Search
CPC ............ H01L 29/66795; H01L 29/785; H01L 21/823431; H01L 27/0886; H01L 21/76224; H01L 21/823418
USPC .................................................. 257/347, 192
See application file for complete search history.

(56) References Cited

U.S. PATENT DOCUMENTS

| 7,872,303 B2 * | 1/2011 | Chan et al. ..................... 257/329 |
| 2007/0096148 A1 * | 5/2007 | Hoentschel et al. .......... 257/192 |
| 2008/0035997 A1 * | 2/2008 | Hofmann et al. ............. 257/347 |
| 2012/0161238 A1 * | 6/2012 | Scheiper et al. .............. 257/368 |
| 2013/0277685 A1 * | 10/2013 | Goto et al. ..................... 257/192 |

OTHER PUBLICATIONS

Duan, B. et al., "New Thin-Film Power MOSFETs With a Buried Oxide Double Step Structure" IEEE Electron Device Letters (May 2006) pp. 377-379, vol. 27, No. 5.

* cited by examiner

*Primary Examiner* — Marc Armand
*Assistant Examiner* — Quinton Brasfield
(74) *Attorney, Agent, or Firm* — Scully, Scott, Murphy & Presser, P.C.

(57) ABSTRACT

A semiconductor fin suspended above a top surface of a semiconductor layer and supported by a gate structure is formed. An insulator layer is formed between the top surface of the semiconductor layer and the gate structure. A gate spacer is formed, and physically exposed portions of the semiconductor fin are removed by an anisotropic etch. Subsequently, physically exposed portions of the insulator layer can be etched with a taper. Alternately, a disposable spacer can be formed prior to an anisotropic etch of the insulator layer. The lateral distance between two openings in the dielectric layer across the gate structure is greater than the lateral distance between outer sidewalls of the gate spacers. Selective deposition of a semiconductor material can be performed to form raised active regions.

9 Claims, 15 Drawing Sheets

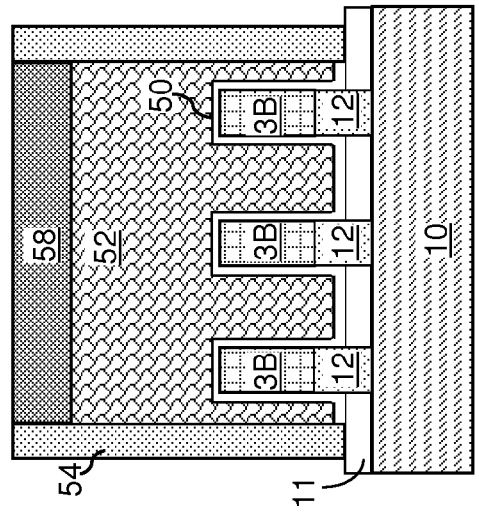
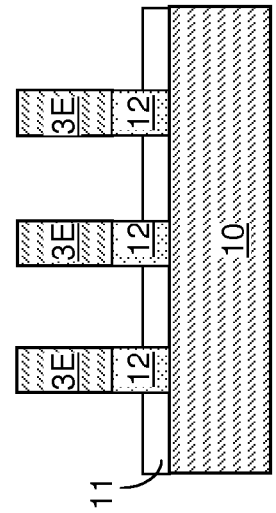
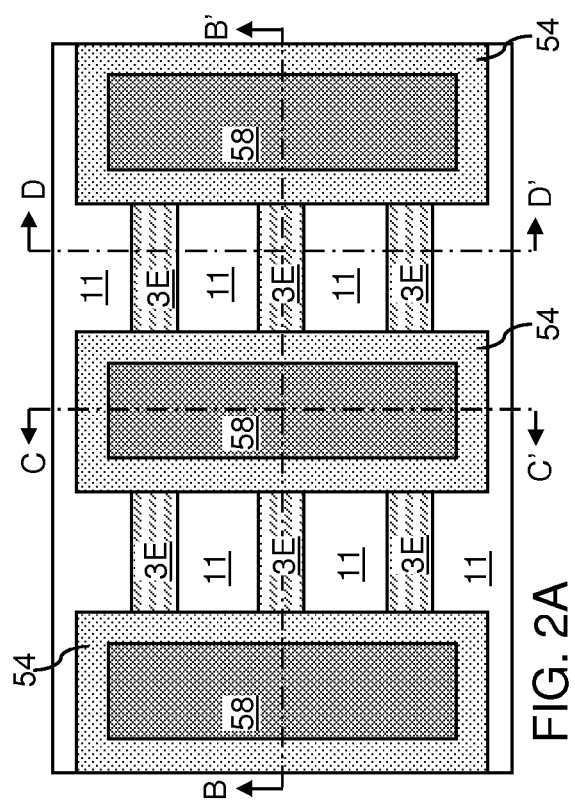
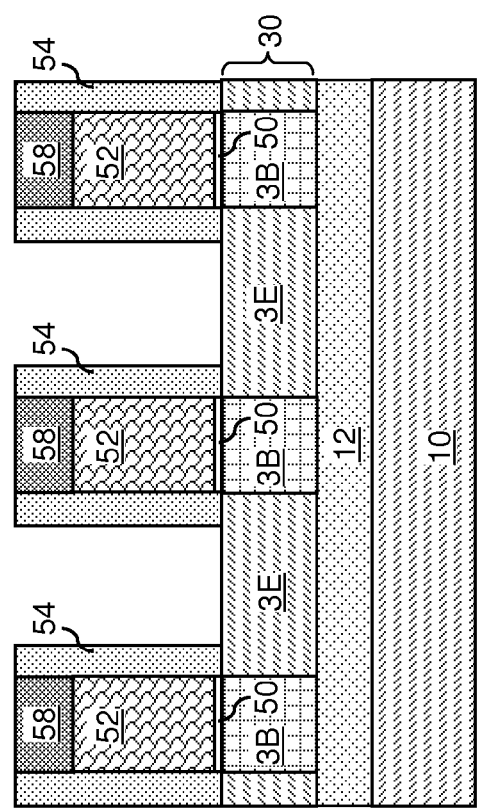
FIG. 2A
FIG. 2B
FIG. 2C
FIG. 2D

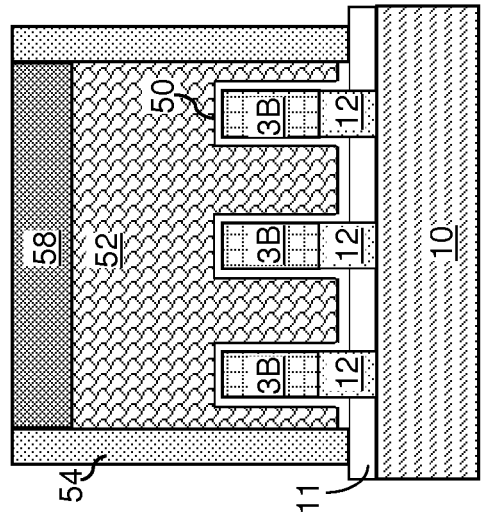
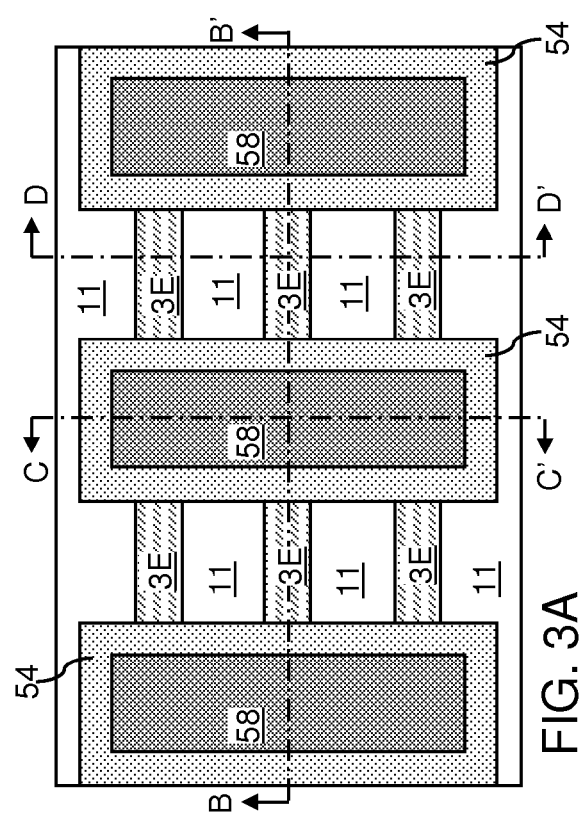
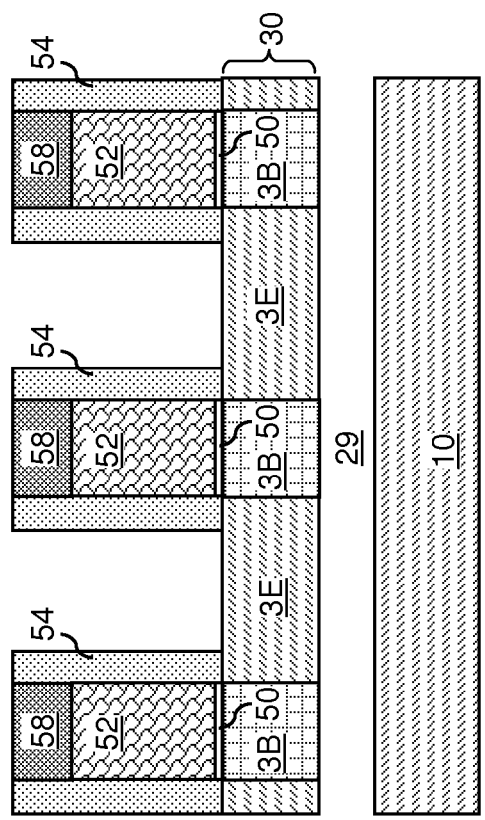

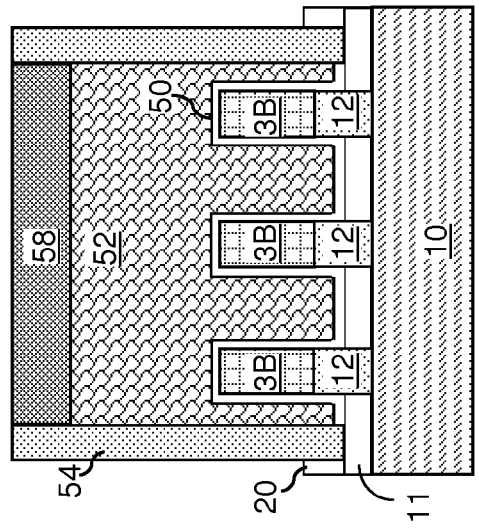
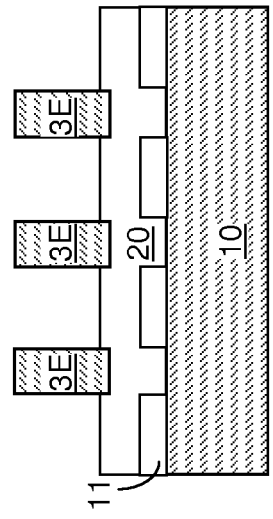
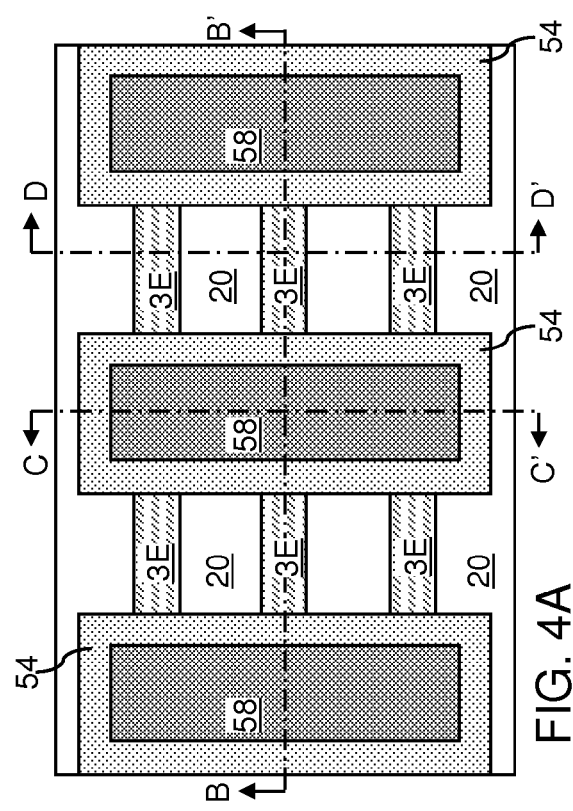
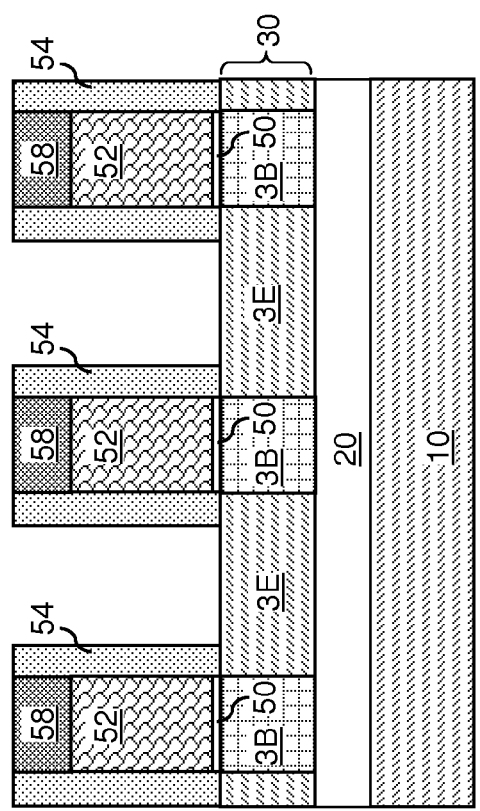

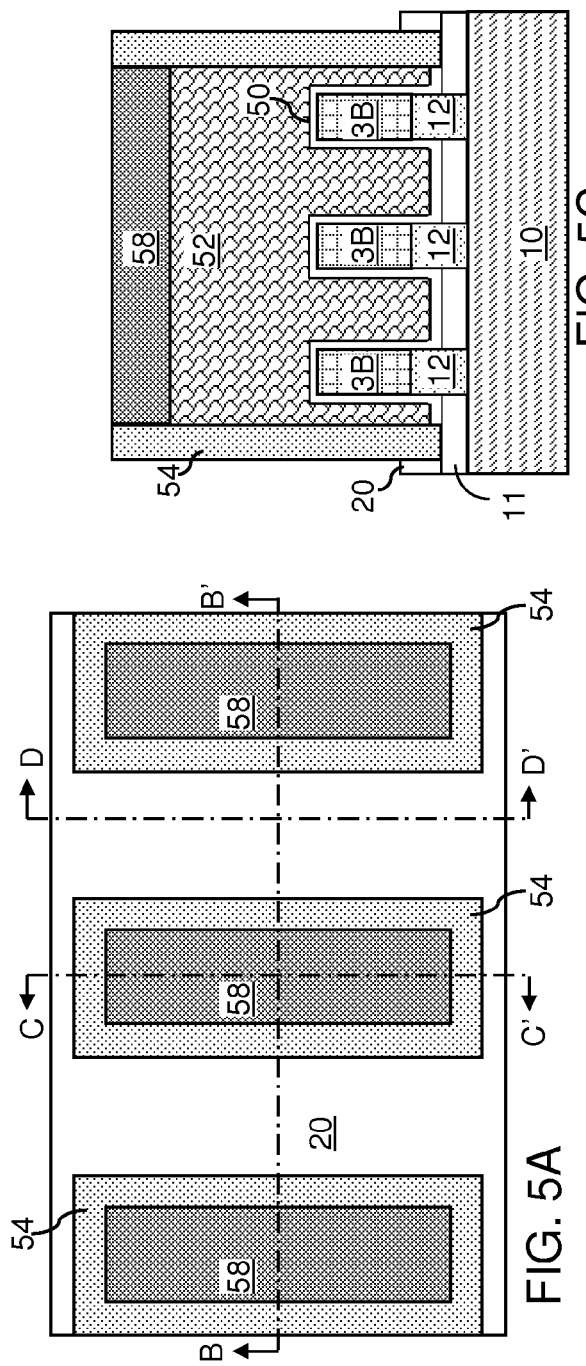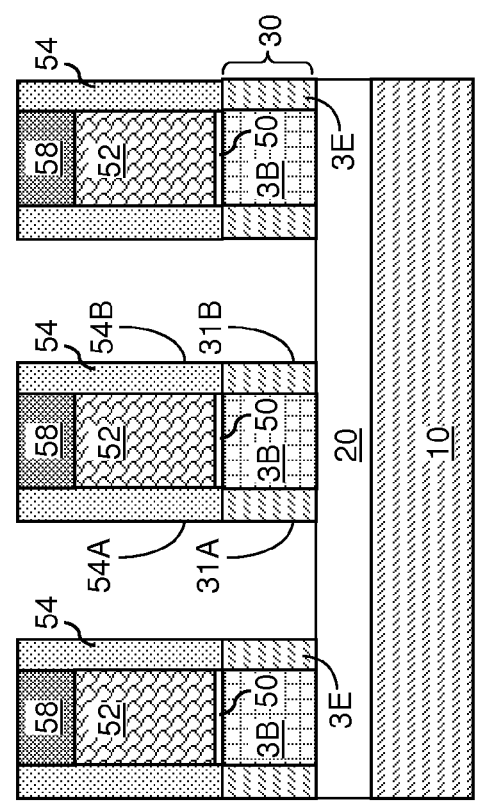

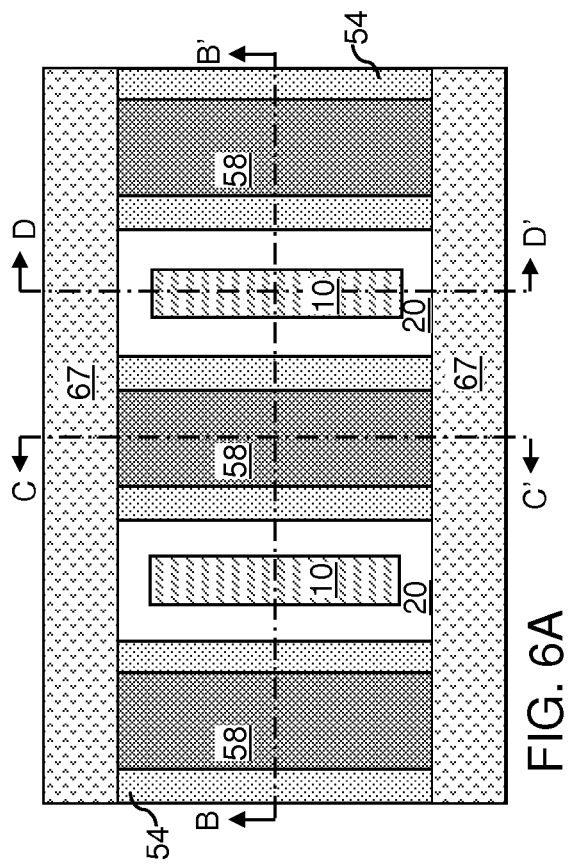
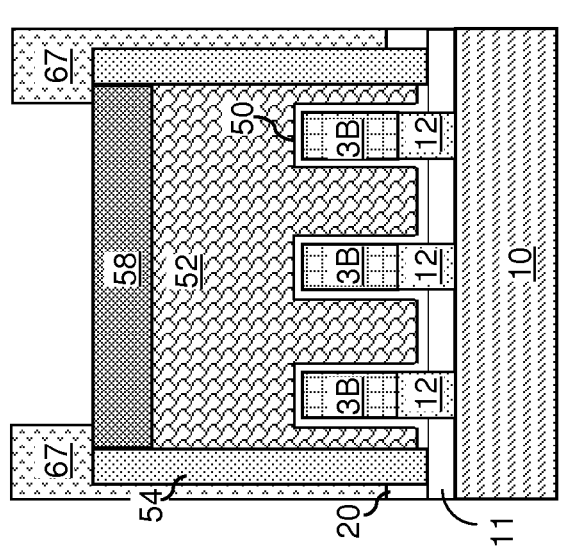
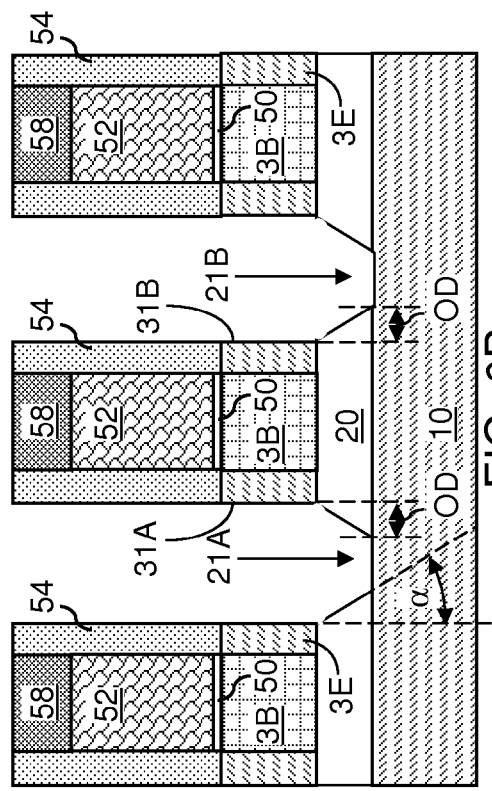
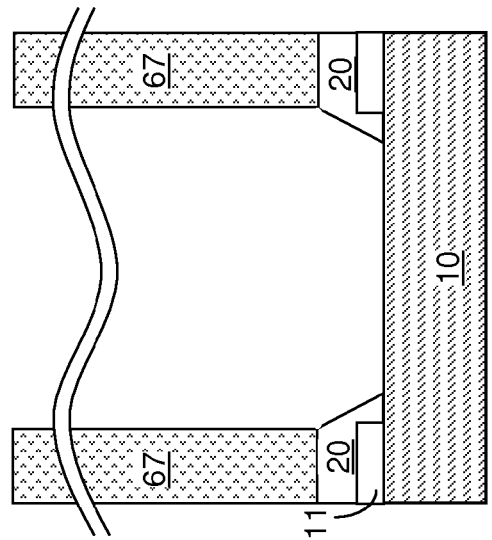

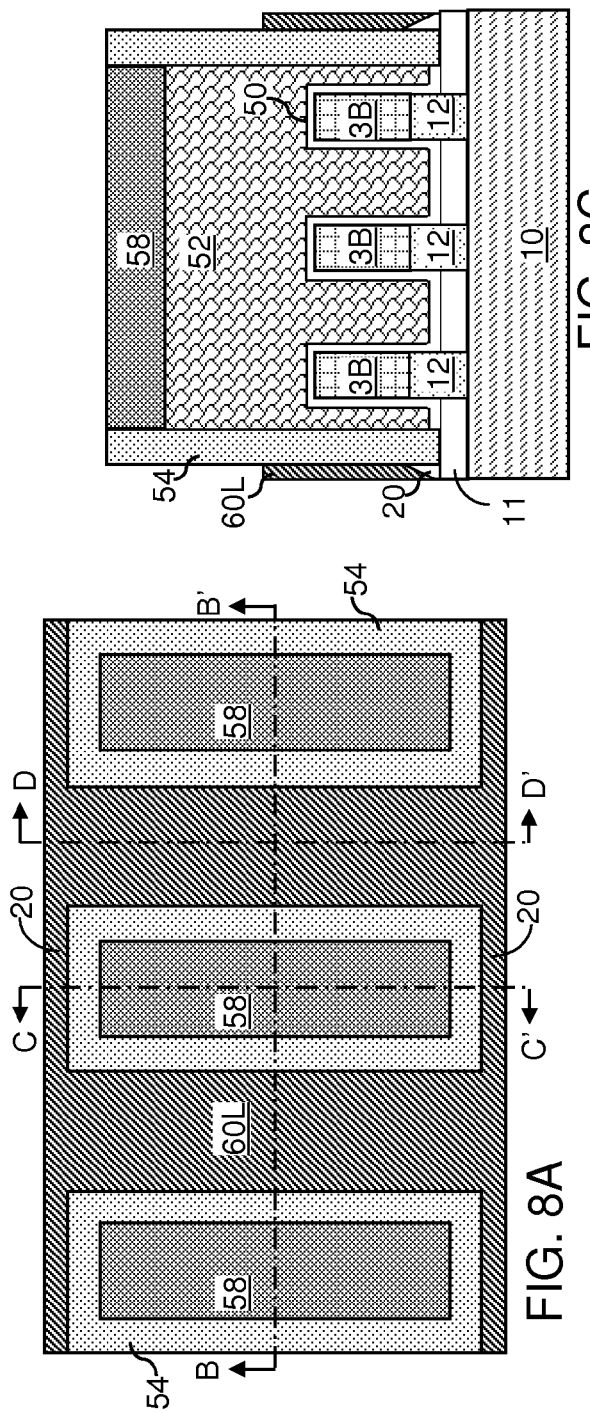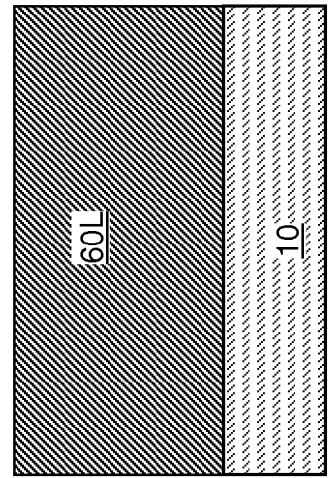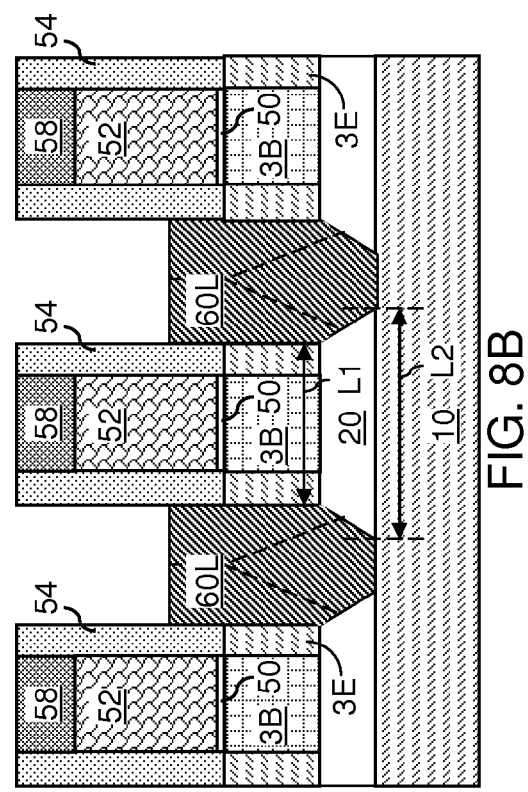

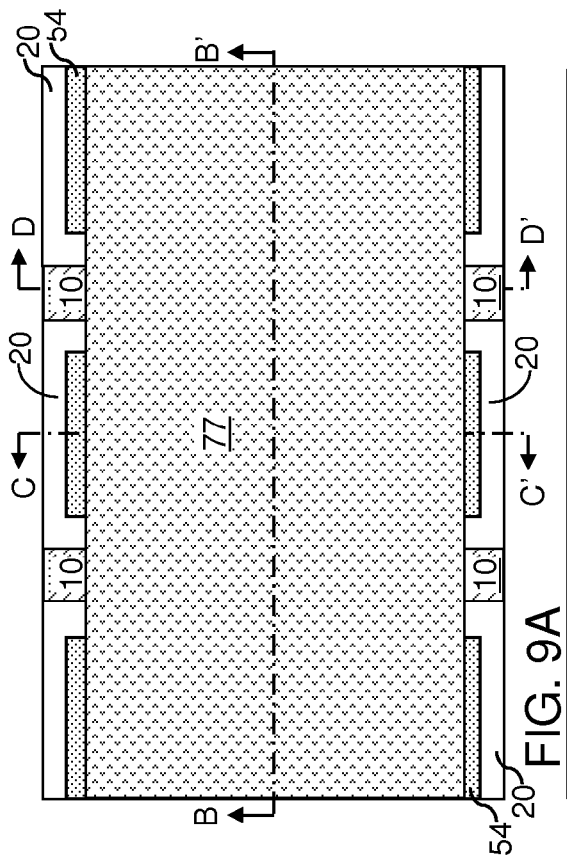
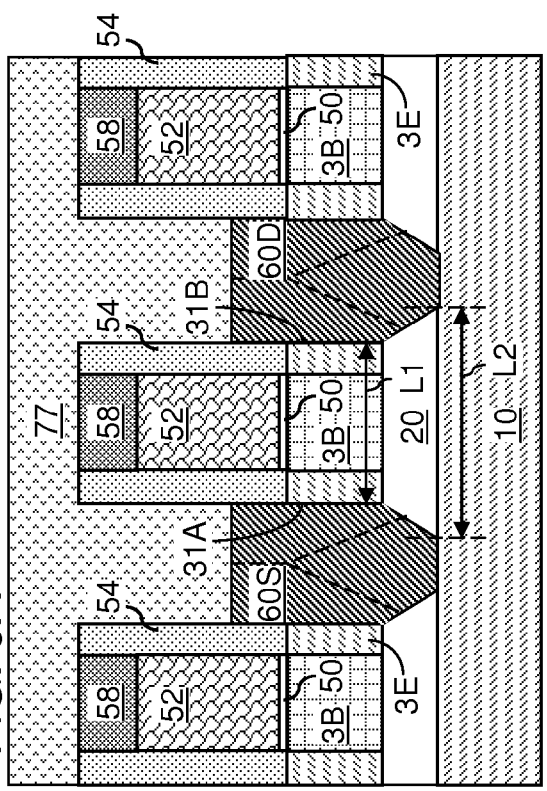
FIG. 9A
FIG. 9B
FIG. 9C
FIG. 9D

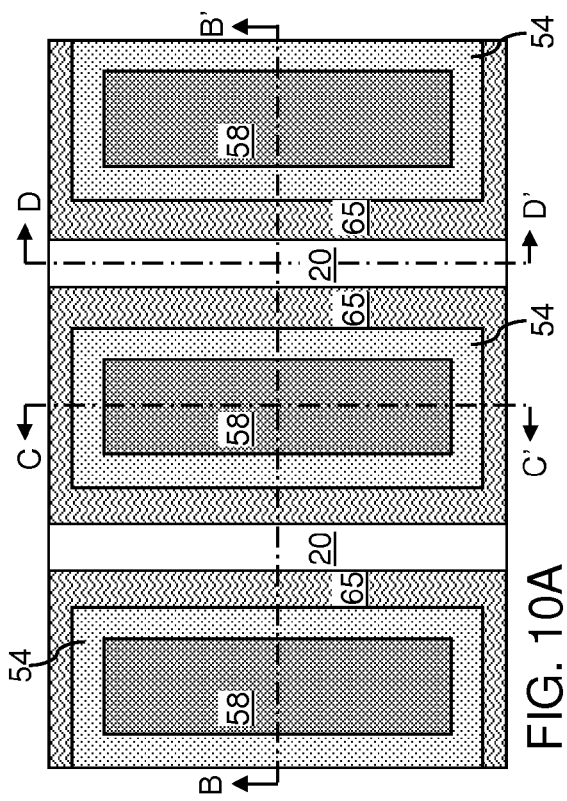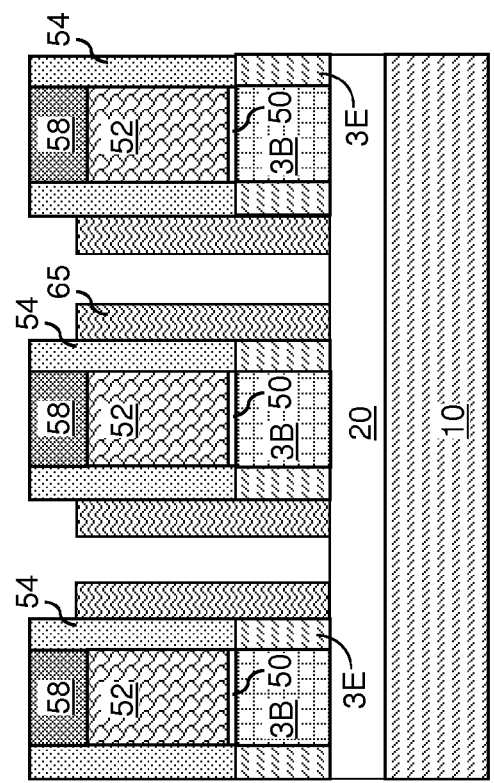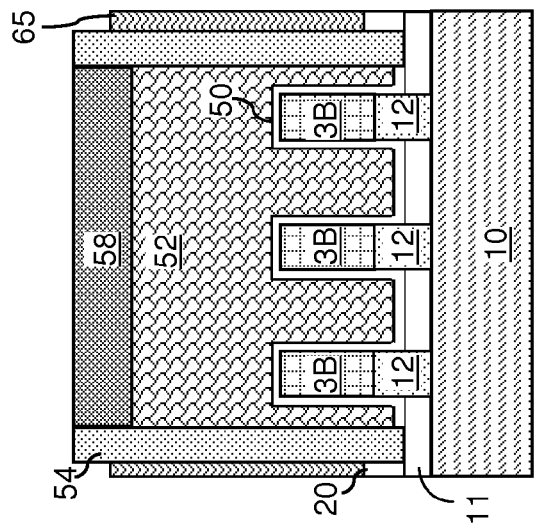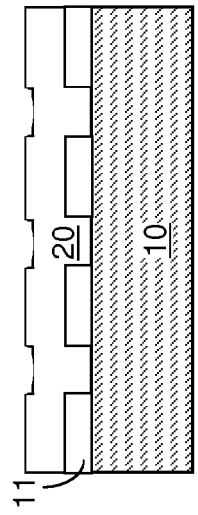

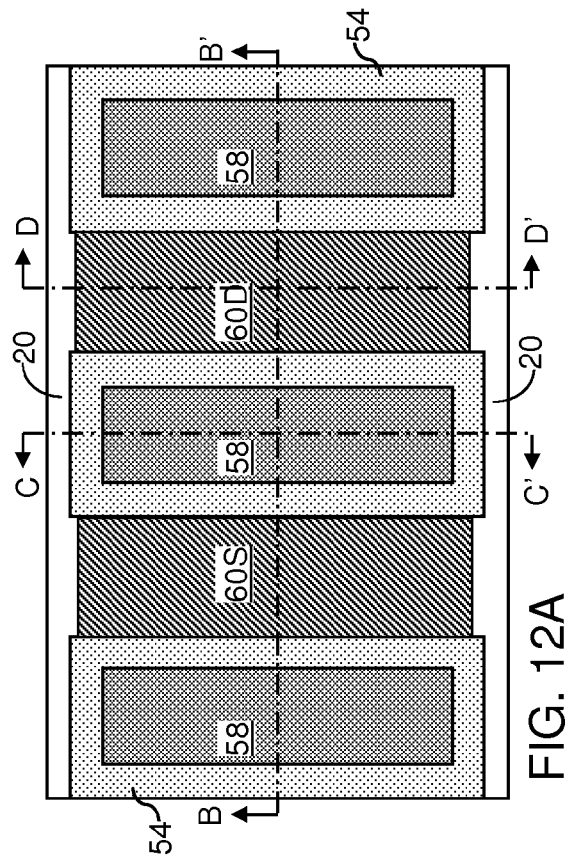
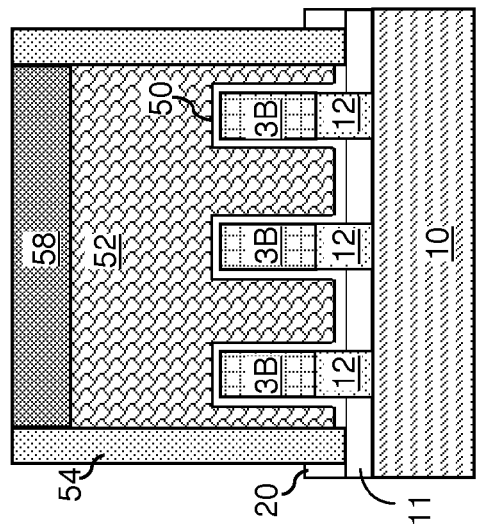
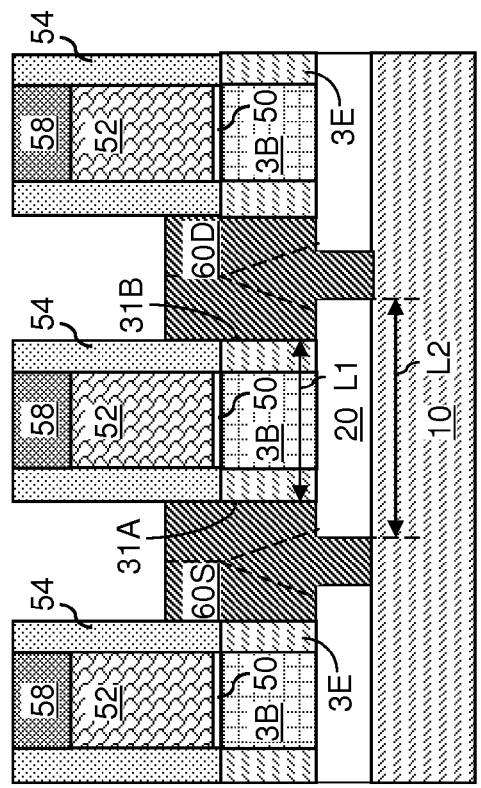
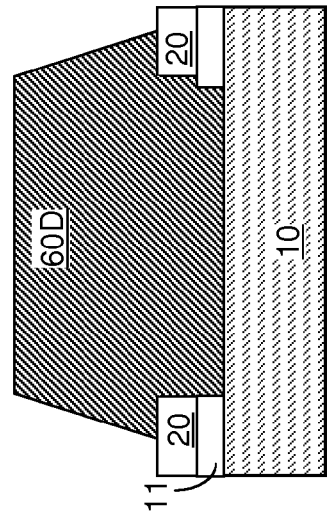

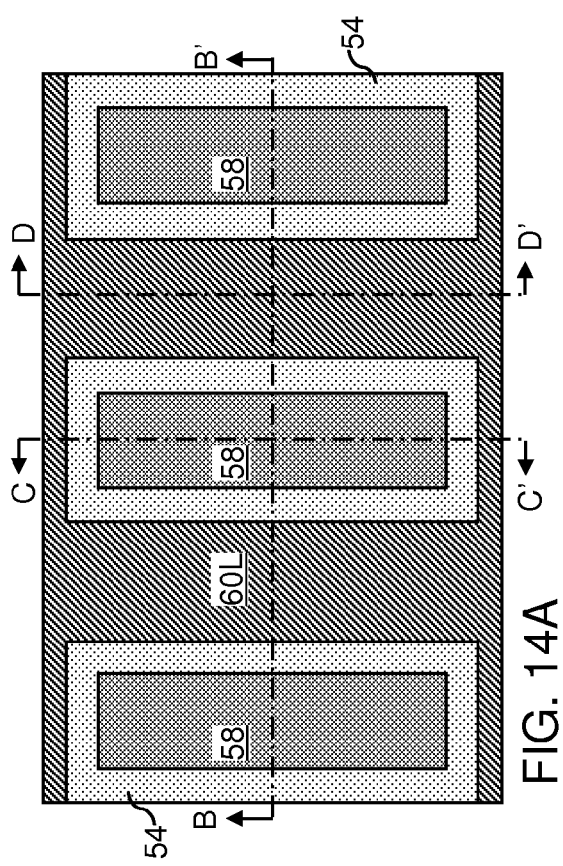
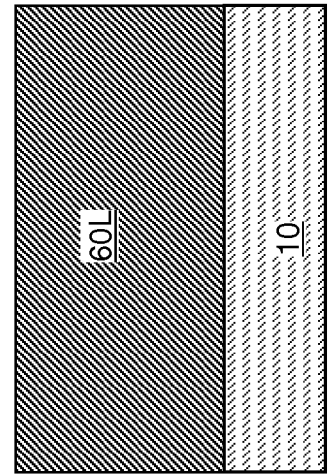
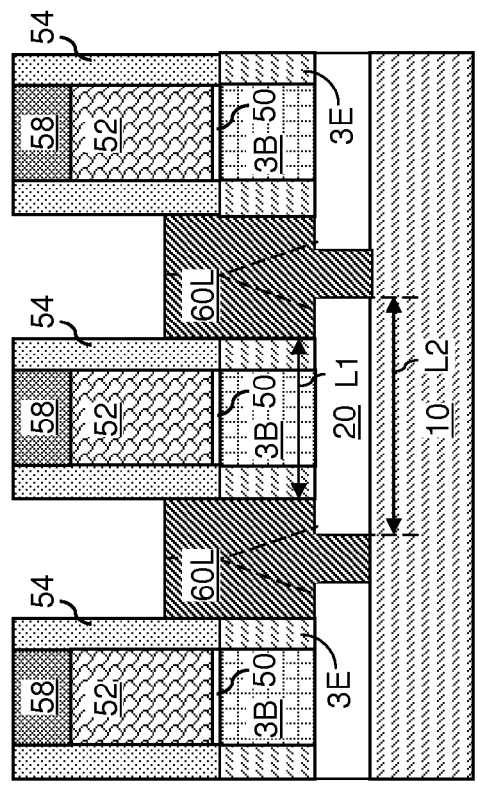
FIG. 14A
FIG. 14B
FIG. 14C
FIG. 14D

PARTIAL FIN ON OXIDE FOR IMPROVED ELECTRICAL ISOLATION OF RAISED ACTIVE REGIONS

BACKGROUND

The present disclosure relates to a semiconductor structure, and more particularly to a semiconductor-fin-on-oxide structure providing reduced leakage current, and a method of manufacturing the same.

Semiconductor-fin-on-insulator structures refer to a structure in which at least one portion of a semiconductor fin is vertically spaced from an underlying semiconductor material layer by an insulator layer. A fin field effect transistor employing a semiconductor-fin-on-insulator structure can have enhanced electrical isolation between the channel region and the underlying semiconductor material layer compared with a fin field effect transistor that does not employ an insulating layer between the channel and the underlying semiconductor material layer.

Despite the enhanced electrical isolation of the channel from the underlying semiconductor material layer, fin field effect transistors employing a semiconductor-fin-on-insulator structure suffer from drain-induced fringing field originating from the bottom of a drain sidewall, extending through the insulator layer, and terminating on the bottom of the channel, which results in a parasitic leakage path. Further, the source-to-drain distance at the bottom of the source region and the drain region below the portion of the insulator layer underneath the channel is the same as the channel length. This feature results in a significant source-to-drain leakage current underneath the channel through the underlying semiconductor material layer where the effect of the electrical field applied by the voltage at the gate electrode is insignificant. The source-drain leakage current underneath the channel necessitates formation of a punchthrough stopper region having a high concentration of electrical dopants.

SUMMARY

A semiconductor fin suspended above a top surface of a semiconductor layer and supported by a gate structure is formed. An insulator layer is formed between the top surface of the semiconductor layer and the gate structure. A gate spacer is formed, and physically exposed portions of the semiconductor fin are removed by an anisotropic etch. Subsequently, physically exposed portions of the insulator layer can be etched with a taper. Alternately, a disposable spacer can be formed prior to an anisotropic etch of the insulator layer. The lateral distance between two openings in the dielectric layer across the gate structure is greater than the lateral distance between outer sidewalls of the gate spacers. Selective deposition of a semiconductor material can be performed to form raised active regions. The bottommost portions of the raised active regions are laterally spaced from each other by a greater distance than top portions of the raised active regions, thereby reducing a leakage current through the semiconductor layer.

According to an aspect of the present disclosure, a semiconductor structure includes a semiconductor material layer located in a substrate. An insulator layer contacts a top surface of the semiconductor material layer and includes a first opening and a second opening therein. A semiconductor fin contacts a top surface of the insulator layer. A gate stack contacts a top surface and sidewalls of the semiconductor fin. A source region fills the first opening, contacts a first portion of the top surface of the semiconductor material layer, and contacts a first end wall of the semiconductor fin that adjoins the sidewalls of the semiconductor fin. A drain region fills the second opening, contacts a second portion of the top surface of the semiconductor material layer, and contacts a second end wall of the semiconductor fin that adjoins the sidewalls of the semiconductor fin, wherein a least lateral distance between the first portion of the top surface and the second portion of the top surface is greater than a lateral distance between the first end wall and the second end wall.

According to another aspect of the present disclosure, a method of forming a semiconductor structure is provided. A structure is provided, which includes a semiconductor material layer, an insulator layer contacting a portion of a top surface of the semiconductor material layer, a semiconductor fin overlying a portion of the insulator layer, a gate stack straddling the semiconductor fin, and a gate spacer laterally surrounding the gate stack. Physically exposed portions of the semiconductor fin are removed. A remaining portion of the semiconductor fin has a first end surface that is vertically coincident with a first outer sidewall of the gate spacer, and a second end surface that is vertically coincident with a second outer sidewall of the gate spacer. A first opening and a second opening extending to the semiconductor material layer through the insulator layer are formed. A lateral offset distance between a bottom periphery of the first opening and the first end surface is the same as a lateral offset distance between a bottom periphery of the second opening and the second end surface.

BRIEF DESCRIPTION OF SEVERAL VIEWS OF THE DRAWINGS

FIG. 2A is a top-down view of the first exemplary semiconductor structure after formation of gate stacks and gate spacers according to the first embodiment of the present disclosure.

FIG. 2B is a vertical cross-sectional view of the first exemplary semiconductor structure along the vertical plane B-B' in FIG. 2A.

FIG. 2C is a vertical cross-sectional view of the first exemplary semiconductor structure along the vertical plane C-C' in FIG. 2A.

FIG. 2D is a vertical cross-sectional view of the first exemplary semiconductor structure along the vertical plane D-D' in FIG. 2A.

FIG. 3A is a top-down view of the first exemplary semiconductor structure after removal of a disposable material layer according to the first embodiment of the present disclosure.

FIG. 3B is a vertical cross-sectional view of the first exemplary semiconductor structure along the vertical plane B-B' in FIG. 3A.

FIG. 3C is a vertical cross-sectional view of the first exemplary semiconductor structure along the vertical plane C-C' in FIG. 3A.

FIG. 3D is a vertical cross-sectional view of the first exemplary semiconductor structure along the vertical plane D-D' in FIG. 3A.

FIG. 4A is a top-down view of the first exemplary semiconductor structure after formation of an insulator layer according to the first embodiment of the present disclosure.

FIG. 4B is a vertical cross-sectional view of the first exemplary semiconductor structure along the vertical plane B-B' in FIG. 4A.

FIG. 4C is a vertical cross-sectional view of the first exemplary semiconductor structure along the vertical plane C-C' in FIG. 4A.

FIG. 4D is a vertical cross-sectional view of the first exemplary semiconductor structure along the vertical plane D-D' in FIG. 4A.

FIG. 5A is a top-down view of the first exemplary semiconductor structure after removal of physically exposed portions of the semiconductor fins by an anisotropic etch according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 6A is a top-down view of the first exemplary semiconductor structure after formation of tapered openings in the insulator layer according to the first embodiment of the present disclosure.

FIG. 6B is a vertical cross-sectional view of the first exemplary semiconductor structure along the vertical plane B-B' in FIG. 6A.

FIG. 6C is a vertical cross-sectional view of the first exemplary semiconductor structure along the vertical plane C-C' in FIG. 6A.

FIG. 6D is a vertical cross-sectional view of the first exemplary semiconductor structure along the vertical plane D-D' in FIG. 6A.

FIG. 8A is a top-down view of a variation of the first exemplary semiconductor structure after formation of an active semiconductor material layer according to the first embodiment of the present disclosure.

FIG. 8B is a vertical cross-sectional view of the variation of the first exemplary semiconductor structure along the vertical plane B-B' in FIG. 8A.

FIG. 8C is a vertical cross-sectional view of the variation of the first exemplary semiconductor structure along the vertical plane C-C' in FIG. 8A.

FIG. 8D is a vertical cross-sectional view of the variation of the first exemplary semiconductor structure along the vertical plane D-D' in FIG. 8A.

FIG. 9A is a top-down view of a variation of the first exemplary semiconductor structure after formation of a source region and a drain region by patterning the active semiconductor layer material according to the first embodiment of the present disclosure.

FIG. 9B is a vertical cross-sectional view of the variation of the first exemplary semiconductor structure along the vertical plane B-B' in FIG. 9A.

FIG. 9C is a vertical cross-sectional view of the variation of the first exemplary semiconductor structure along the vertical plane C-C' in FIG. 9A.

FIG. 9D is a vertical cross-sectional view of the variation of the first exemplary semiconductor structure along the vertical plane D-D' in FIG. 9A.

FIG. 10A is a top-down view of a second exemplary semiconductor structure after formation of a disposable spacer according to the second embodiment of the present disclosure.

FIG. 10B is a vertical cross-sectional view of the second exemplary semiconductor structure along the vertical plane B-B' in FIG. 10A.

FIG. 10C is a vertical cross-sectional view of the second exemplary semiconductor structure along the vertical plane C-C' in FIG. 10A.

FIG. 10D is a vertical cross-sectional view of the second exemplary semiconductor structure along the vertical plane D-D' in FIG. 10A.

FIG. 12A is a top-down view of the second exemplary semiconductor structure after formation of a source region and a drain region according to the second embodiment of the present disclosure.

FIG. 12B is a vertical cross-sectional view of the second exemplary semiconductor structure along the vertical plane B-B' in FIG. 12A.

FIG. 12C is a vertical cross-sectional view of the second exemplary semiconductor structure along the vertical plane C-C' in FIG. 12A.

FIG. 12D is a vertical cross-sectional view of the second exemplary semiconductor structure along the vertical plane D-D' in FIG. 12A.

FIG. 14A is a top-down view of a variation of the second exemplary semiconductor structure after formation of an active semiconductor material layer according to the second embodiment of the present disclosure.

FIG. 14B is a vertical cross-sectional view of the second exemplary semiconductor structure along the vertical plane B-B' in FIG. 14A.

FIG. 14C is a vertical cross-sectional view of the second exemplary semiconductor structure along the vertical plane C-C' in FIG. 14A.

FIG. 14D is a vertical cross-sectional view of the second exemplary semiconductor structure along the vertical plane D-D' in FIG. 14A.

DETAILED DESCRIPTION

Figure 1C:
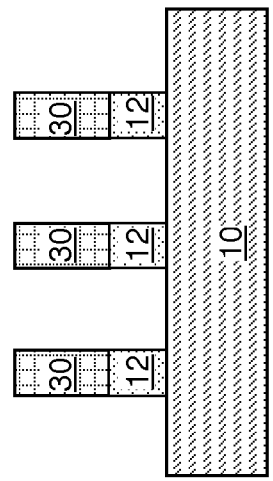
FIG. 1C is a vertical cross-sectional view of the first exemplary semiconductor structure along the vertical plane C-C' in FIG. 1A.

As stated above, the present disclosure relates to a semiconductor-fin-on-oxide structure providing reduced leakage current, and a method of manufacturing the same. Aspects of the present disclosure are now described in detail with accompanying figures. It is noted that like reference numerals refer to like elements across different embodiments. The drawings are not necessarily drawn to scale.

Figure 1D:
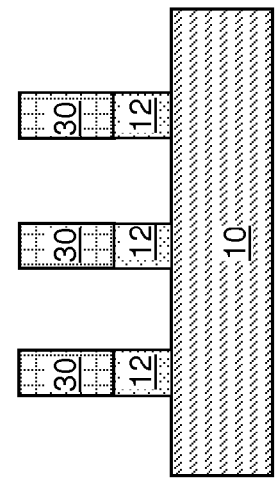
FIG. 1D is a vertical cross-sectional view of the first exemplary semiconductor structure along the vertical plane D-C' in FIG. 1A.
Figure 1A:
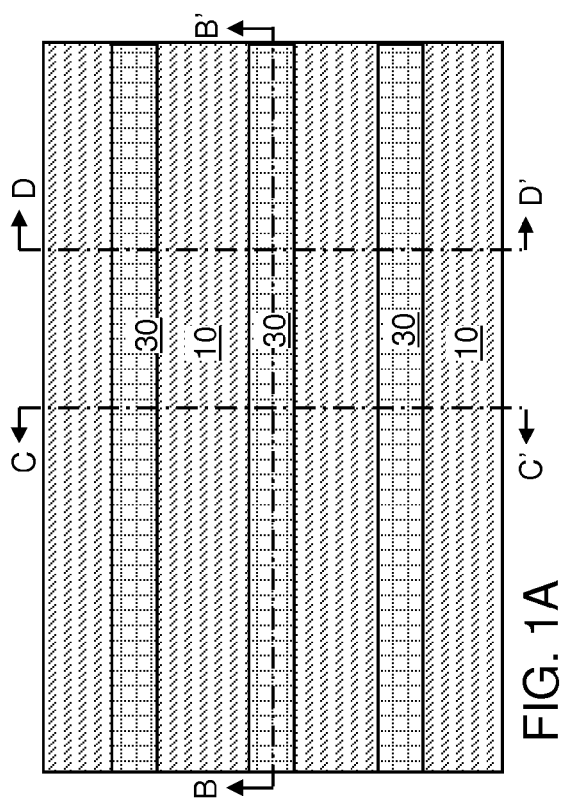
FIG. 1A is a top-down view of a first exemplary semiconductor structure after formation of a plurality of semiconductor fins according to a first embodiment of the present disclosure.
Figure 1B:
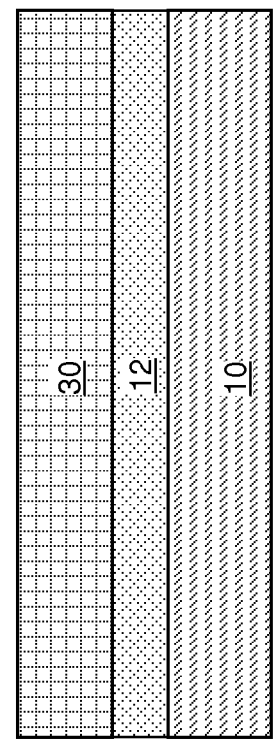
FIG. 1B is a vertical cross-sectional view of the first exemplary semiconductor structure along the vertical plane B-B' in FIG. 1A.

Referring to FIGS. 1A-1D, a first exemplary semiconductor structure according to a first embodiment of the present disclosure includes a semiconductor material layer 10. The semiconductor material layer 10 can be a bulk semiconductor substrate including a first semiconductor material.

The first semiconductor material may be selected from, but is not limited to, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the first semiconductor material can be silicon. In one embodiment, the first semiconductor material can be single crystalline silicon.

A disposable material layer and a top semiconductor layer are sequentially formed on the top surface of the semiconductor material layer. The disposable material layer includes a single crystalline material that can be subsequently removed selective to the first semiconductor material and the material of the top semiconductor layer. The top semiconductor layer can include a single crystalline semiconductor material layer that includes a second semiconductor material. The second semiconductor material may be the same as, or different from, the first semiconductor material. In one embodiment, the first semiconductor material and the second semiconductor material can be silicon, and the disposable material layer can be a silicon-germanium alloy layer or a germanium that can be removed selective to silicon. In this case, the atomic concentration of germanium in the disposable material layer can be in a range from 30% to 100%. The thickness of the disposable material layer can be in a range from 10 nm to 200 nm, although lesser and greater thicknesses can also be employed. The thickness of the top semiconductor layer can be in a range from 15 nm to 300 nm, although lesser and greater thicknesses can also be employed.

The top semiconductor layer and the disposable material layer are patterned, for example, by applying and patterning a photoresist layer, and transferring the pattern in the photoresist layer through the top semiconductor layer and the disposable material layer by an anisotropic etch. A plurality of stacks can be formed such that each stack includes, from bottom to top, a disposable material portion 12 and a semiconductor fin 30. As used herein, a "semiconductor fin" refers to a semiconductor material portion having a pair of parallel sidewalls. Thus, each semiconductor fin 30 has a uniform width that is invariant under translation along a lengthwise horizontal direction of the semiconductor fins 30. It is understood that line edge roughness introduced during manufacturing processes can be inherently present within each pair of parallel sidewalls. The height of each semiconductor fin 30 can be greater than the width of the semiconductor fin 30. Each disposable material portion 12 is a remaining portion of the disposable material layer. Each semiconductor fin 30 is a remaining portion of the top semiconductor layer. In one embodiment, each semiconductor fin 30 is epitaxially aligned to an underlying disposable material portion 12. Each disposable material portion 12 can be epitaxially aligned to the semiconductor material layer 10.

Referring to FIGS. 2A-2D, a planar oxide layer 11 can be optionally formed on the top surface of the semiconductor material layer. The planar oxide layer 11 includes a dielectric oxide material, which can be, for example, silicon oxide. The planar oxide layer 11 can be formed, for example, by spin-on coating of a flowable oxide material and a densification anneal, or can be formed by deposition of a silicon oxide material, planarization employing the top surface of the semiconductor fins 30 as a stopping layer, and recessing of the silicon oxide material with respect to the semiconductor fins 30. An upper portion of each sidewall of the disposable material portions 12 is physically exposed, while a lower portion of each sidewall of the disposable material portions 12 contacts the planar oxide layer 11. The planar oxide layer 11 laterally surrounds the stacks of the disposable material portions 12 and the semiconductor fins 30, and is herein referred to as a local trench oxide layer.

Gate stacks (50, 52, 58) are formed over the vertical stacks (12, 30) of the disposable material portions 12 and the semiconductor fins 30. Each gate stack (50, 52, 58) can be formed by depositing a stack of a gate dielectric layer, a gate conductor layer, and a gate cap dielectric layer, and by patterning the stack of the gate dielectric layer, the gate conductor layer, and the gate cap dielectric layer. The patterning of the stack can be performed, for example, by application and lithographic patterning of a photoresist layer, and by performing at least one anisotropic etch employing the patterned photoresist layer as an etch mask. Each gate stack (50, 52, 58) can include a gate dielectric 50, a gate electrode 52, and a gate cap dielectric 58. Each gate stack (50, 52, 58) can straddle the plurality of vertical stacks (12, 30) of a disposable material portion 12 and a semiconductor fin 30.

Doped extension regions 3E can be formed, for example, by implantation of electrical dopants into physically exposed portions of the semiconductor fins 30. Unimplanted portions of the semiconductor fins 30 constitute body regions 3B. If the semiconductor fins 30 as provided at the processing steps of FIGS. 1A-1D have a doping of a first conductivity type, the dopants implanted to form the doped extension regions 3E can have the opposite conductivity type of the first conductivity type, which is herein referred to as a second conductivity type. For example, if the first conductivity type is p-type, the second conductivity type is n-type, and vice versa. In one embodiment, the body regions 3B can have a doping of the first conductivity type, or can be intrinsic. In one embodiment, the semiconductor material layer 10 can have a doping of the opposite conductivity type of the conductivity type of the doped extension regions. In other words, the semiconductor material layer 10 can have a doping of the first conductivity type, and the doped extension regions 3E can have a doping of the second conductivity type.

Prior to, or after, formation of the doped extension regions 3E, a gate spacer 54 can be formed around each gate stack (50, 52, 58). The gate spacer 54 can be formed, for example, by depositing a conformal dielectric material layer and by anisotropically etching the conformal dielectric material layer by an anisotropic etch. The anisotropic etch recesses the portions of the conformal dielectric material layer located on sidewalls of the semiconductor fins 30 and the disposable material portions 12 and laterally spaced from the gate electrodes (50, 52, 58) by a distance greater than the thickness of the conformal dielectric layer. The remaining vertical portions of the conformal dielectric material layer constitute the gate spacer 54. Sidewalls of the semiconductor fins 30 and the disposable material portions 12 are physically exposed after formation of the gate spacer 54.

Referring to FIGS. 3A-3D, the disposable material portions 12 can be removed from underneath the plurality of semiconductor fins 30. An isotropic etch that is selective to the first semiconductor material and the second semiconductor material can be employed to remove the disposable material portions 12. For example, if the disposable material portions 12 include a silicon-germanium alloy or germanium and if the first and second semiconductor materials comprise silicon, a wet etch employing a combination of hydrofluoric acid and hydrogen peroxide can be employed to remove the disposable material portions 12. During the removal of the disposable material portions 12, each semiconductor fin 30 is mechanically supported by the gate stacks (50, 52, 58). A cavity 29 is formed underneath each semiconductor fin 30, which is mechanically supported by the gate stacks (50, 52, 58) upon removal of the disposable material portions 12.

Referring to FIGS. 4A-4D, an insulator layer 20 is formed above the top surface of the semiconductor material layer 10 and within each cavity 29. The insulator layer 20 can be formed, for example, by spin coating of a dielectric material and/or by conversion of top portions of the semiconductor material layer 10 into a dielectric material. In one embodiment, the insulator layer 20 can include a flowable oxide (FOX) that is spin-coated. In another embodiment, the insulator layer 20 can include a dielectric material derived from thermal conversion or plasma conversion of the semiconductor materials of the top portion of the semiconductor material layer 10 and bottom portions of the semiconductor fins 30. In yet another embodiment, a dielectric material such as silicon oxide can be deposited by a conformal deposition method to fill the cavities 29 and to fill the space between the semiconductor fins 30, planarized down to the top surfaces of the gate cap dielectrics 58, and subsequently recessed to form the insulator layer 20. The conformal deposition of the dielectric material can be performed, for example, by chemical vapor deposition (CVD) and/or atomic layer deposition (ALD). The planarization can be performed, for example, by chemical mechanical planarization (CMP). The top surfaces of the gate cap dielectrics 58 can be employed as a stopping layer. The recessing of the dielectric material can be performed by an anisotropic etch or an isotropic etch that employs the gate cap dielectrics 58 and the gate spacer 54 as an etch mask. The bottom surfaces of the semiconductor fins 30 (or remaining portions of the semiconductor fins 30 after conversion of bottom portions of the semiconductor fins 30) can contact the insulator layer 20. The top surface of the insulator layer 20 may be coplanar with the bottom surfaces of the semiconductor fins 30, or can be formed above the bottom surfaces of the semiconductor fins 30.

The first exemplary structure provided by the processing steps of FIGS. 4A-4D includes the semiconductor material layer 10, the insulator layer 20 contacting a portion of the top surface of the semiconductor material layer 10, and semiconductor fins 30. Each semiconductor fin 30 overlies a portion of the insulator layer 20. Gate stacks (50, 52, 58) straddle the semiconductor fins 30. Each gate stack (50, 52, 58) includes at least a gate electrode 52 and a gate dielectric 50 contacting a planar oxide layer 11 and sidewalls of the semiconductor fins 30.

Referring to FIGS. 5A-5D, physically exposed portions of the semiconductor fins 30 are removed by an anisotropic etch. The combination of the gate stacks (50, 52, 58) and the gate spacers 54 can be employed as an etch mask during the anisotropic etch. Each remaining portion of the semiconductor fins 30 has a first end surface 31A that is vertically coincident with a first outer sidewall 54A of a gate spacer 54 and a second end surface 31B that is vertically coincident with a second outer sidewall 54B of the gate spacer 54. As used herein, a first surface is vertically coincident with a second surface if there exists a vertical plane within which the first surface and the second surface are located. A top surface of the insulator layer 20 can be physically exposed between each neighboring pair of gate spacers 54.

Referring to FIGS. 6A-6D, a photoresist layer 67 is applied over the gate stacks (50, 52, 58), the gate spacers 54, and the insulator layer 20, and is lithographically patterned to cover regions in which formation of active semiconductor regions is to be suppressed. As used herein, active semiconductor regions refer to source regions and drain regions. In one embodiment, the photoresist layer 67 can cover end portions of the gate stacks (50, 52, 58) that do not overlie the semiconductor fins 30, and physically expose regions that overlie the semiconductor fins 30.

An anisotropic etch is performed to remove physically exposed portions of the insulator layer 20. The anisotropic etch can employ the combination of the gate stacks (50, 52, 58), the gate spacers 54, and the photoresist layer 67 as an etch mask. An opening can be formed between each neighboring pair of gate spacers 54 such that a portion of the top surface of the semiconductor material layer 10 is physically exposed at a bottom portion of the opening. In one embodiment, the opening can be formed with a taper. The taper angle $\alpha$ is measured between an end surface of a semiconductor fin 30 and a surface of an opening that adjoins a bottom edge of the end surface of the semiconductor fin 30. In one embodiment, the magnitude of the taper angle $\alpha$ can be in a range from 1 degree to 45 degrees. In another embodiment, the magnitude of the taper angle $\alpha$ can be in a range from 3 degree to 30 degrees. In one embodiment, the magnitude of the taper angle $\alpha$ can be in a range from 6 degree to 20 degrees. In one embodiment, the magnitude of the taper angle $\alpha$ can be in a range from 9 degree to 15 degrees.

For example, a first opening 21A and a second opening 21B can be formed through the insulator layer 20. Each of the first opening 21A and the second opening 21B extends to the semiconductor material layer 10 through the insulator layer 20. The lateral offset distance OD between the bottom periphery of the first opening 21A and the first end surface 31A can be the same as the lateral offset distance OD between the bottom periphery of the second opening 21B and the second end surface 31B. An edge at which the first opening 21A adjoins the top surface of the insulator layer 20 can be vertically coincident with the first end surface 31A, and an edge at which the second opening 21B adjoins the top surface of the insulator layer 20 can be vertically coincident with the second end surface 31B.

Figure 7C:
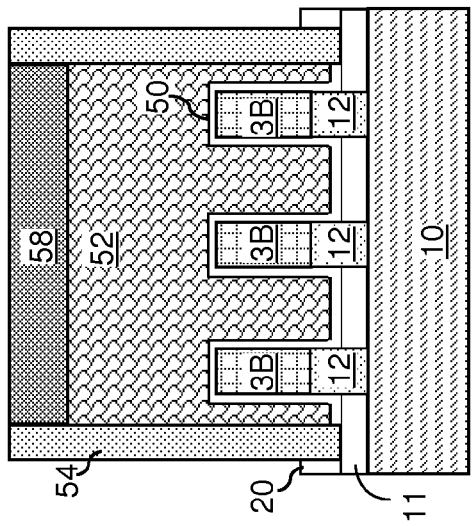
FIG. 7C is a vertical cross-sectional view of the first exemplary semiconductor structure along the vertical plane C-C' in FIG. 7A.
Figure 7D:
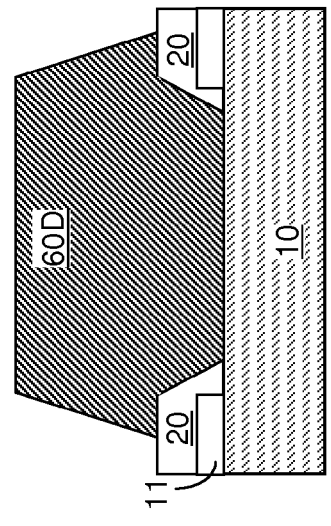
FIG. 7D is a vertical cross-sectional view of the first exemplary semiconductor structure along the vertical plane D-D' in FIG. 7A.
Figure 7A:
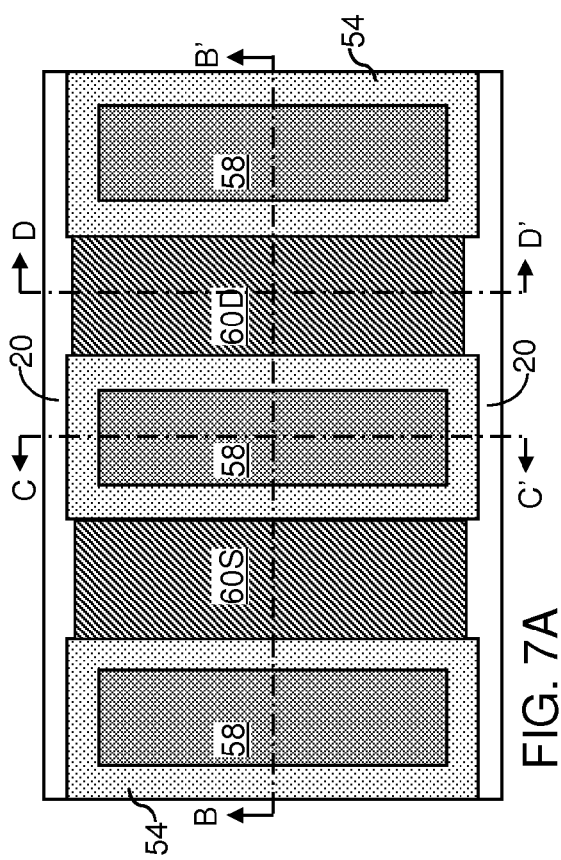
FIG. 7A is a top-down view of the first exemplary semiconductor structure after formation of a raised source region and a raised drain region according to the first embodiment of the present disclosure.
Figure 7B:
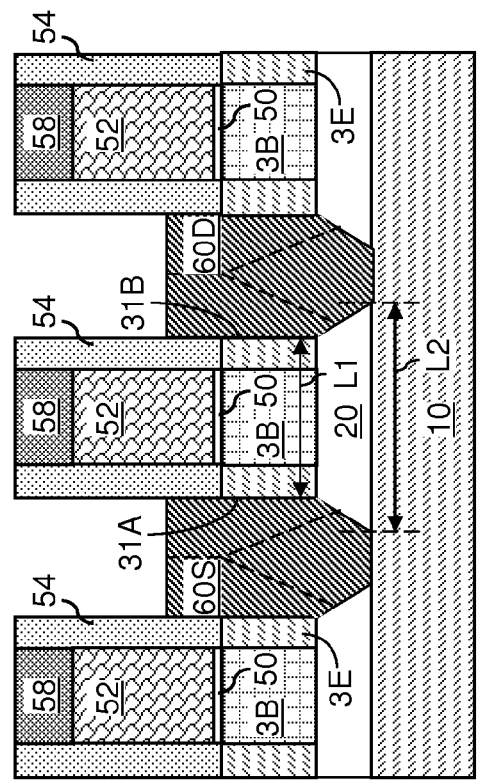
FIG. 7B is a vertical cross-sectional view of the first exemplary semiconductor structure along the vertical plane B-B' in FIG. 7A.

Referring to FIGS. 7A-7D, a semiconductor material can be deposited on each physically exposed portion of the semiconductor material layer 10 and each physically exposed end surface of the semiconductor fins (3B, 3E). At least one source region 60S and at least one drain region 60D can be formed, for example, by selective epitaxy of a semiconductor material. In an illustrative example, a source region 60S can be formed on a first portion of the semiconductor material layer 10 underneath the first opening 21A (See FIG. 6B) and on the first end surface 31A, and a drain region 60D can be formed on a second portion of the second semiconductor material layer 30 underneath the second opening 21B (See FIG. 6B) and on the second end surface 31B.

In one embodiment, each source region 60S and each drain region 60D can include a single crystalline semiconductor material portion that is epitaxially aligned to the second semiconductor material of the semiconductor fins (3B, 3E) or the first semiconductor material of the semiconductor material layer 10. As used herein, "epitaxial" alignment refers to alignment of atoms in a same singe crystalline structure. For example, each of the semiconductor fins (3B, 3E) and the semiconductor material layer 10 can be single crystalline, and each of the source region(s) 60S and the drain region(s) 60D can include a portion that is epitaxially aligned to the semiconductor material layer 10 and at least another portion that is epitaxially aligned to a semiconductor fin (3B, 3E).

The semiconductor material of each source region 60S and each drain region 60D can be the same as, or different from, the second semiconductor material, i.e., the semiconductor material of the plurality of semiconductor fins (3B, 3E). Further, the semiconductor material of each source region 60S and each drain region 60D can be the same as, or different from, the first semiconductor material, i.e., the semiconductor material of the semiconductor material layer 10.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the deposited semiconductor material is the difference between the deposition rate of a semiconductor material due to the reactant gas less the etch rate of the semiconductor material due to the etchant gas. The selective epitaxy process does not deposit any semiconductor material on dielectric surfaces such as the surfaces of the inner gate spacer 54 or the surface of the insulator layer 20 because any semiconductor material that nucleates on the dielectric surfaces is etched by the etchant gas before a contiguous layer of a deposited semiconductor material can be formed on the dielectric surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

In one embodiment, each source region 60S and each drain region 60D can be formed with in-situ doping so that each source region 60S and each drain region 60D are doped with electrical dopants during the selective epitaxy. The source region 60S and the drain region 60D can be doped with electrical dopants of the second conductivity type, which is the opposite of the first conductivity type. For example, if the first conductivity type (which is the conductivity type of the plurality of semiconductor fins 30) is p-type, the second conductivity type is n-type, and vice versa.

Alternately, each source region 60S and each drain region 60D can be formed without doping so that each source region 60S and each drain region 60D are formed as intrinsic semiconductor material portions. In this case, electrical dopants can be introduced into the source region(s) 60S and the drain region(s) 60D in a subsequent processing step.

In one embodiment, grain boundaries may be present within each source region 60S and each drain region 60D because each source region 60S or each drain region 60D can include a plurality of single crystalline grains that grow from different single crystalline surfaces. For example, each source region 60S or each drain region 60D can include a single crystalline grain that grows from a surface of the semiconductor material layer 10, and a plurality of grains that grow from different end surfaces of semiconductor fins (3B, 3E). In one embodiment, at least one grain boundary can contact the tapered surfaces of the insulator layer 20.

The first exemplary semiconductor structure can include the semiconductor material layer 10 located in a substrate, the insulator layer 20 contacting the top surface of the semiconductor material layer 10 and including a first opening and a second opening therein, a semiconductor fin (3B, 3E) contacting the top surface of the insulator layer 20, and a gate stack (50, 52, 58) including a gate dielectric 50 and a gate electrode 52 and contacting a top surface and sidewalls of the at least one semiconductor fin (3B, 3E). A source region 60S fills the first opening, contacts a first portion of the top surface of the semiconductor material layer 10, and contacts a first end wall of the semiconductor fin (3B, 3E) that adjoins the sidewalls of the semiconductor fin (3B, 3E). A drain region 60D fills the second opening, contacts a second portion of the top surface of the semiconductor material layer 10, and contacts a second end wall of the semiconductor fin (3B, 3E) that adjoins the sidewalls of the semiconductor fin (3B, 3E). The lateral distance between the first end wall 31A and the second end wall 31B is herein referred to as a first lateral distance L1. A least lateral distance between the first portion of the top surface of the semiconductor material layer 10 in contact with the source region 60S and the second portion of the top surface of the semiconductor material layer 10 in contact with the drain region 60D is herein referred to as a second lateral distance L2. The second lateral distance L2 is greater than the first lateral distance L1 due to the taper of the openings.

A gate spacer laterally surrounds each gate stack (50, 52, 58). A first end wall 31A of a semiconductor fin (3B, 3E) can be vertically coincident with a first outer sidewall of the gate spacer 54, and a second end wall 31B of the semiconductor fin (3B, 3E) can be vertically coincident with a second outer sidewall of the gate spacer 54. Each semiconductor fin (3B, 3E) can include a body region 3B, a source extension region (i.e., one of the two doped extension regions 3E in the semiconductor fin (3B, 3E)) including the first end wall 31A and contacting the body region 3B, and a drain extension region (i.e., the other of the two doped extension regions 3E in the semiconductor fin (3B, 3E)) including the second end wall 31B and contacting the body region 3B and laterally spaced from the source region. The source extension region, the drain extension region, the source region 60S, and the drain region 60D can have a same type of doping, i.e., a doping of the second conductivity type.

In one embodiment, each semiconductor fin (3B, 3E) and the semiconductor material layer 10 can be single crystalline, and each source region 60S and each drain region 60D can include a portion that is epitaxially aligned to the semiconductor material layer 10 and another portion that is epitaxially aligned to a semiconductor fin (3B, 3E). Each of the first opening 21A (See FIG. 6B) and the second opening 21B (See FIG. 6B) can have a tapered surface extending from the top surface of the insulator layer 20 to an interface between the insulator layer 20 and the semiconductor material layer 10. A top edge of the first opening 21A can adjoin the first end wall 31A, and a top edge of the second opening 21B can adjoin the second end wall 31B.

Referring to FIGS. 8A-8D, a variation of the first exemplary semiconductor structure can be derived from the first exemplary semiconductor structure of FIGS. 5A-5D by performing the processing steps of FIGS. 6A-6D without employing the photoresist layer 67 (See FIGS. 6A-6D). Thus, the anisotropic etch process that forms tapered openings through the insulator layer 20 is performed employing the combination of the gate stacks (50, 52, 48) and the gate spacers 54 as an etch mask. All areas of the top surface of the semiconductor material layer 10 that do not underlie the gate stacks (50, 52, 58) or the gate spacers 54 and laterally spaced from the outer periphery of the gate spacers 54 by a lateral distance greater than the thickness of the gate spacer 54 are physically exposed after the anisotropic etch.

The selective deposition step of FIGS. 7A-7D is subsequently performed to form an active semiconductor material layer 60L. The active semiconductor material layer 60L can include the same semiconductor material as the at least one source region 60S and the at least one drain region 60D shown in FIGS. 6A-6D. The active semiconductor material layer 60L can include a portion epitaxially aligned to a physically exposed top surface of the semiconductor material layer 10 and portions that are epitaxially aligned to the end surfaces of the semiconductor fins (3B, 3E). The active semiconductor material layer 60L is doped with dopants of the second conductivity type by in-situ doping or ex-situ doping.

Referring to FIGS. 9A-9D, a photoresist layer 77 is applied over the active semiconductor material layer 60L, and is lithographically patterned to cover areas in which at least one source region 60S and at least one drain region 60D are to be formed. The deposited semiconductor material of the active semiconductor material layer 60L is patterned employing the patterned photoresist layer 77 as an etch mask. Physically exposed portions of the active semiconductor material layer 60L can be removed by an anisotropic etch. Portions of the top surface of the semiconductor material layer 10 can be physically exposed after patterning the deposited semiconductor material. A first remaining portion of the active semiconductor material layer 60L contacting the first end wall 31A is a source region 60S, and a remaining portion of the active semiconductor material layer 60L contacting the second end wall 31B is a drain region 60D. The photoresist layer 77 can be subsequently removed, for example, by ashing.

Referring to FIGS. 10A-10D, a second exemplary semiconductor structure according to the second embodiment of the present disclosure can be derived from the first exemplary semiconductor structure of FIGS. 5A-5D by depositing a disposable spacer 65 around each gate spacer 54. The disposable spacer 65 can include a semiconductor material, a conductive material, or a dielectric material. In one embodiment, the disposable spacer 65 can include amorphous carbon, organosilicate glass, a porous dielectric material, or germanium. The disposable spacer 65 can be formed, for example, by depositing a conformal material layer, and by anisotropically etching the conformal material layer to remove horizontal portions of the conformal material layer. Each remaining vertical portion of the conformal material layer constitutes a disposable spacer 65.

Figure 11A:
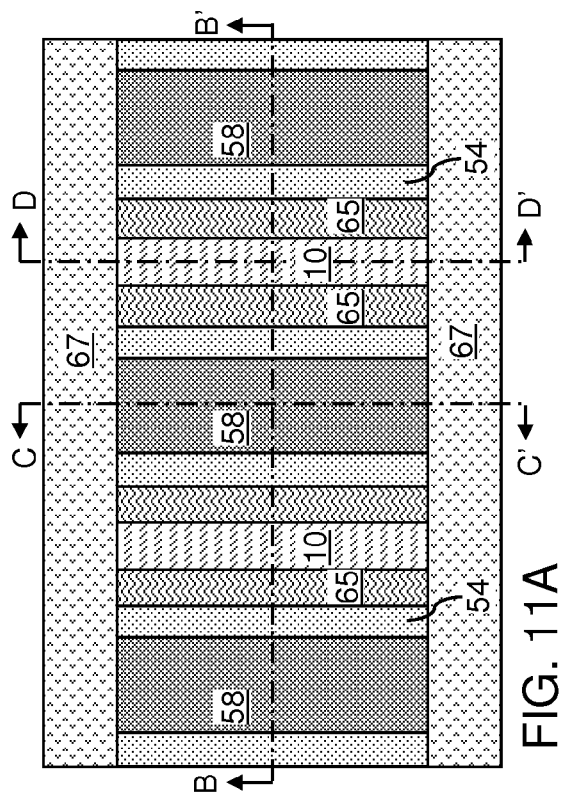
FIG. 11A is a top-down view of the second exemplary semiconductor structure after application and patterning of a photoresist layer and formation of openings in the dielectric layer according to the second embodiment of the present disclosure.
Figure 11B:
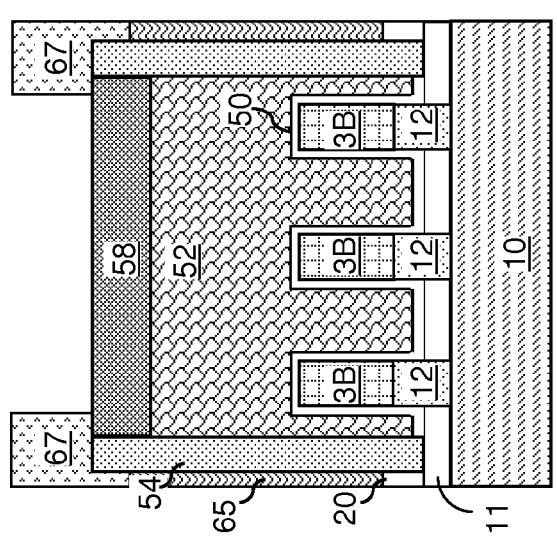
FIG. 11B is a vertical cross-sectional view of the second exemplary semiconductor structure along the vertical plane B-B' in FIG. 11A.
Figure 11C:
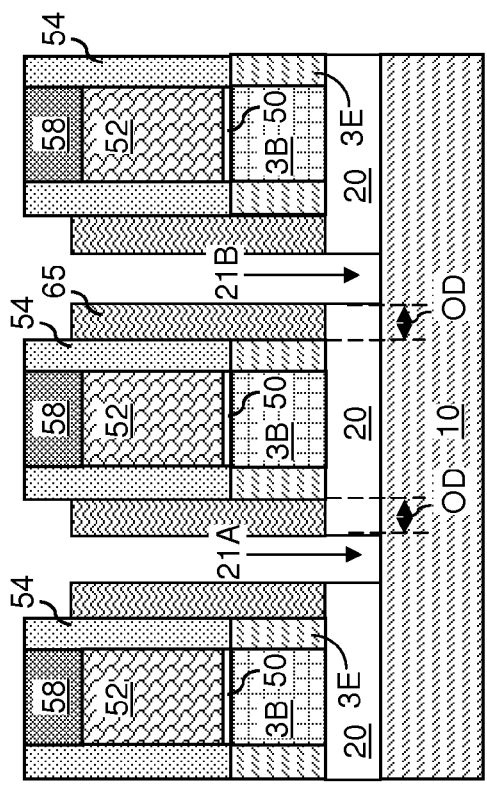
FIG. 11C is a vertical cross-sectional view of the second exemplary semiconductor structure along the vertical plane C-C' in FIG. 11A.
Figure 11D:
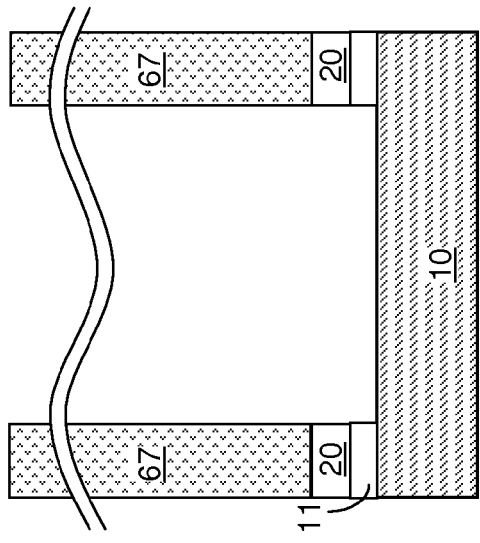
FIG. 11D is a vertical cross-sectional view of the second exemplary semiconductor structure along the vertical plane D-D' in FIG. 11A.

Referring to FIGS. 11A-11D, a photoresist layer 67 is applied over the gate stacks (50, 52, 58), the gate spacers 54, and the insulator layer 20, and is lithographically patterned to cover regions in which formation of active semiconductor regions is to be suppressed. In one embodiment, the photoresist layer 67 can cover end portions of the gate stacks (50, 52, 58) that do not overlie the semiconductor fins 30, and physically expose regions that overlie the semiconductor fins 30.

An anisotropic etch is performed to remove physically exposed portions of the insulator layer 20. The anisotropic etch can employ the combination of the gate stacks (50, 52, 58), the gate spacers 54, the disposable spacers 65, and the photoresist layer 67 as an etch mask. An opening can be formed between each neighboring pair of disposable spacers 65 such that a portion of the top surface of the semiconductor material layer 10 is physically exposed at a bottom portion of the opening. The opening can be formed with substantially vertical sidewalls or with a taper. As used herein, a sidewall is substantially vertical if the angle between the sidewall and a vertical direction is less than 1 degree.

For example, a first opening 21A and a second opening 21B can be formed through the insulator layer 20. Each of the first opening 21A and the second opening 21B extends to the semiconductor material layer 10 through the insulator layer 20. In one embodiment, sidewalls of the openings (21A, 21B) can be vertically coincident with sidewalls of the disposable spacers 65. Because the disposable spacers 54 have the same thickness, the lateral offset distance OD between the bottom periphery of the first opening 21A and the first end surface 31A can be the same as the lateral offset distance OD between the bottom periphery of the second opening 21B and the second end surface 31B. An edge at which the first opening 21A adjoins the top surface of the insulator layer 20 can be laterally offset from the first end surface 31A by the thickness of the disposable spacers 65, which is the lateral offset distance OD. Likewise, an edge at which the second opening 21B adjoins the top surface of the insulator layer 20 can be vertically offset from the second end surface 31B by the thickness of the disposable spacers 65. The photoresist layer 67 can be subsequently removed, for example, by ashing. The disposable spacer 65 can be removed, for example, by ashing, wet etch, dry etch, or any other removal method that is selective to the gate spacers 54 and the first semiconductor material of the semiconductor material layer 10.

Referring to FIGS. 12A-12D, the processing steps of FIGS. 7A-7D are performed. Thus, a semiconductor material can be deposited on each physically exposed portion of the semiconductor material layer 10 and each physically exposed end surface of the semiconductor fins (3B, 3E). At least one source region 60S and at least one drain region 60D can be formed, for example, by selective epitaxy of a semiconductor material. In an illustrative example, a source region 60S can be formed on a first portion of the semiconductor material layer 10 underneath the first opening 21A (See FIG. 11B) and on the first end surface 31A, and a drain region 60D can be formed on a second portion of the second semiconductor material layer 30 underneath the second opening 21B (See FIG. 11B) and on the second end surface 31B.

In one embodiment, each source region 60S and each drain region 60D can include a single crystalline semiconductor material portions that are epitaxially aligned to the second semiconductor material of the semiconductor fins (3B, 3E) or the first semiconductor material of the semiconductor material layer 10. For example, each of the semiconductor fins (3B, 3E) and the semiconductor material layer 10 can be single crystalline, and each of the source region(s) 60S and the drain region(s) 60D can include a portion that is epitaxially aligned to the semiconductor material layer 10 and at least another portion that is epitaxially aligned to a semiconductor fin (3B, 3E).

The semiconductor material of each source region 60S and each drain region 60D can be the same as, or different from, the second semiconductor material, i.e., the semiconductor material of the plurality of semiconductor fins (3B, 3E). Further, the semiconductor material of each source region 60S and each drain region 60D can be the same as, or different from, the first semiconductor material, i.e., the semiconductor material of the semiconductor material layer 10.

In one embodiment, each source region 60S and each drain region 60D can be formed with in-situ doping so that each source region 60S and each drain region 60D are doped with electrical dopants during the selective epitaxy. The source region 60S and the drain region 60D can be doped with electrical dopants of the second conductivity type, which is the opposite of the first conductivity type. For example, if the first conductivity type (which is the conductivity type of the plurality of semiconductor fins 30) is p-type, the second conductivity type is n-type, and vice versa.

Alternately, each source region 60S and each drain region 60D can be formed without doping so that each source region 60S and each drain region 60D are formed as intrinsic semiconductor material portions. In this case, electrical dopants can be introduced into the source region(s) 60S and the drain region(s) 60D in a subsequent processing step.

In one embodiment, grain boundaries may be present within each source region 60S and each drain region 60D because each source region 60S or each drain region 60D can include a plurality of single crystalline grains that grow from different single crystalline surfaces. For example, each source region 60S or each drain region 60D can include a single crystalline grain that grows from a surface of the semiconductor material layer 10, and a plurality of grains that grow from different end surfaces of semiconductor fins (3B, 3E). In one embodiment, at least one grain boundary can contact the surfaces of the insulator layer 20.

The second exemplary semiconductor structure can include the semiconductor material layer 10 located in a substrate, the insulator layer 20 contacting the top surface of the semiconductor material layer 10 and including a first opening and a second opening therein, a semiconductor fin (3B, 3E) contacting the top surface of the insulator layer 20, and a gate stack (50, 52, 58) including a gate dielectric 50 and a gate electrode 52 and contacting a top surface and sidewalls of the at least one semiconductor fin (3B, 3E). A source region 60S fills the first opening, contacts a first portion of the top surface of the semiconductor material layer 10, and contacts a first end wall of the semiconductor fin (3B, 3E) that adjoins the sidewalls of the semiconductor fin (3B, 3E). A drain region 60D fills the second opening, contacts a second portion of the top surface of the semiconductor material layer 10, and contacts a second end wall of the semiconductor fin (3B, 3E) that adjoins the sidewalls of the semiconductor fin (3B, 3E). The lateral distance between the first end wall 31A and the second end wall 31B is herein referred to as a first lateral distance L1. A least lateral distance between the first portion of the top surface of the semiconductor material layer 10 in contact with the source region 60S and the second portion of the top surface of the semiconductor material layer 10 in contact with the drain region 60D is herein referred to as a second lateral distance L2. The second lateral distance L2 is greater than the first lateral distance L1 due to the lateral offset between the top periphery of each opening and a most proximal end wall of semiconductor fins (3B, 3E).

A gate spacer laterally surrounds each gate stack (50, 52, 58). A first end wall 31A of a semiconductor fin (3B, 3E) can be vertically coincident with a first outer sidewall of the gate spacer 54, and a second end wall 31B of the semiconductor fin (3B, 3E) can be vertically coincident with a second outer sidewall of the gate spacer 54. Each semiconductor fin (3B, 3E) can include a body region 3B, a source extension region (i.e., one of the two doped extension regions 3E in the semiconductor fin (3B, 3E)) including the first end wall 31A and contacting the body region 3B, and a drain extension region (i.e., the other of the two doped extension regions 3E in the semiconductor fin (3B, 3E)) including the second end wall 31B and contacting the body region 3B and laterally spaced from the source region. The source extension region, the drain extension region, the source region 60S, and the drain region 60D can have a same type of doping, i.e., a doping of the second conductivity type.

In one embodiment, each semiconductor fin (3B, 3E) and the semiconductor material layer 10 can be single crystalline, and each source region 60S and each drain region 60D can include a portion that is epitaxially aligned to the semiconductor material layer 10 and another portion that is epitaxially aligned to a semiconductor fin (3B, 3E).

In one embodiment, a sidewall of the first opening 21A (See FIG. 11B) adjoins the top surface of the insulator layer 20 at a periphery that is laterally offset from the first end wall 31A, and a sidewall of the second opening 21B (See FIG. 11B) adjoins the top surface of the insulator layer at another periphery that is laterally offset from the second end wall. In one embodiment, the minimum lateral distance between the periphery and the first end wall 31A is the same as the minimum lateral distance between the other periphery and the second end wall 31B. The minimum lateral distance can be the same as the thickness of the disposable spacers 65 (See FIGS. 11A and 11B). In one embodiment, the first opening and the second opening can have substantially vertical sidewalls.

Figure 13A:
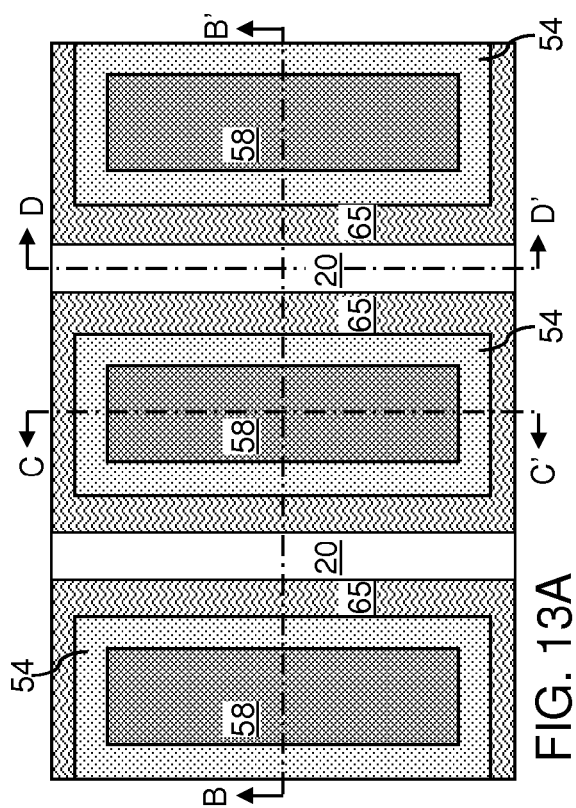
FIG. 13A is a top-down view of a variation of the second exemplary semiconductor structure after formation of openings in the dielectric layer according to the second embodiment of the present disclosure.
Figure 13B:
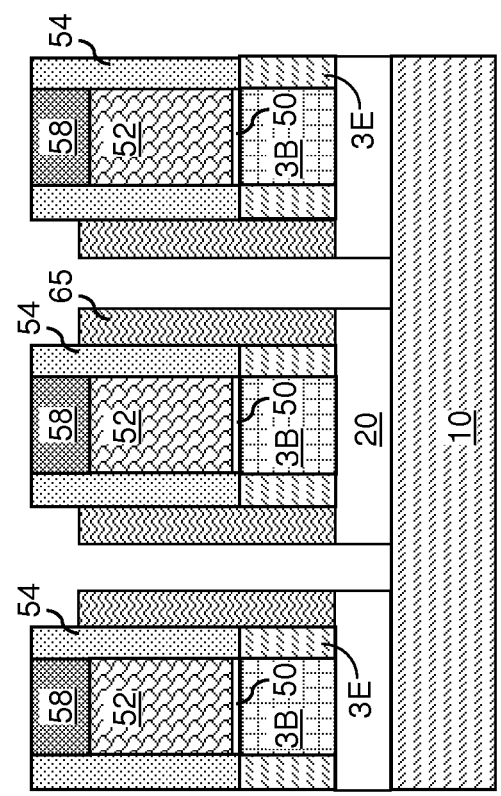
FIG. 13B is a vertical cross-sectional view of the second exemplary semiconductor structure along the vertical plane B-B' in FIG. 13A.
Figure 13C:
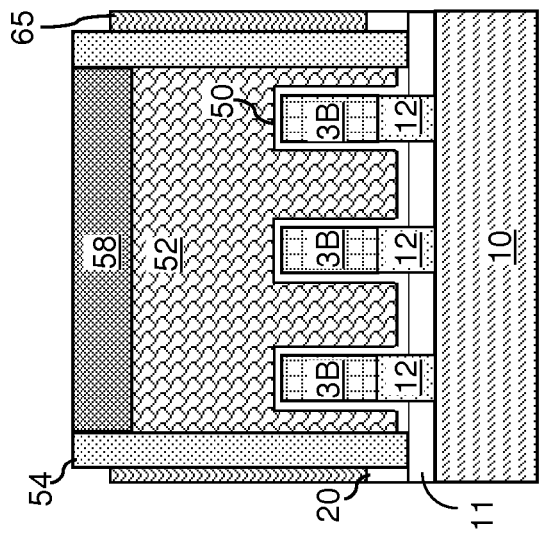
FIG. 13C is a vertical cross-sectional view of the second exemplary semiconductor structure along the vertical plane C-C' in FIG. 13A.
Figure 13D:
FIG. 13D is a vertical cross-sectional view of the second exemplary semiconductor structure along the vertical plane D-D' in FIG. 13A.

Referring to FIGS. 13A-13D, a variation of the second exemplary semiconductor structure can be derived from the second exemplary semiconductor structure of FIGS. 10A-10D by performing the processing steps of FIGS. 11A-11D without employing the photoresist layer 67 (See FIGS. 11A-11D). Thus, the anisotropic etch process that forms tapered openings through the insulator layer 20 is performed employing the combination of the gate stacks (50, 52, 48), the gate spacers 54, and the disposable spacers 65 as an etch mask. All areas of the top surface of the semiconductor material layer 10 that do not underlie the gate stacks (50, 52, 58), the gate spacers 54, or the disposable spacers 65 are physically exposed after the anisotropic etch.

Referring to FIGS. 14A-14D, the selective deposition step of FIGS. 8A-8D is subsequently performed to form an active semiconductor material layer 60L. The active semiconductor material layer 60L can include the same semiconductor material as the at least one source region 60S and the at least one drain region 60D shown in FIGS. 6A-6D or in FIGS. 12A-12D. The active semiconductor material layer 60L can include a portion epitaxially aligned to a physically exposed top surface of the semiconductor material layer 10 and portions that are epitaxially aligned to the end surfaces of the semiconductor fins (3B, 3E). The active semiconductor material layer 60L is doped with dopants of the second conductivity type by in-situ doping or ex-situ doping.

Figure 15C:
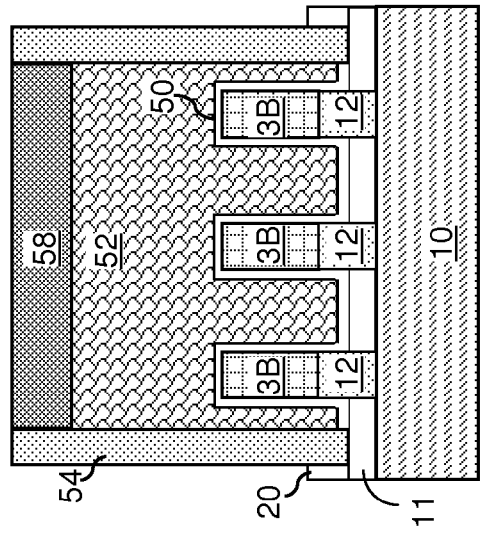
FIG. 15C is a vertical cross-sectional view of the second exemplary semiconductor structure along the vertical plane C-C' in FIG. 15A.
Figure 15D:
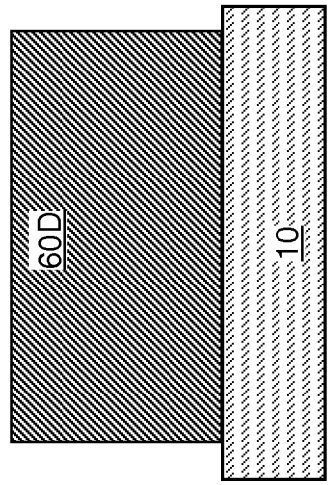
FIG. 15D is a vertical cross-sectional view of the second exemplary semiconductor structure along the vertical plane D-D' in FIG. 15A.
Figure 15A:
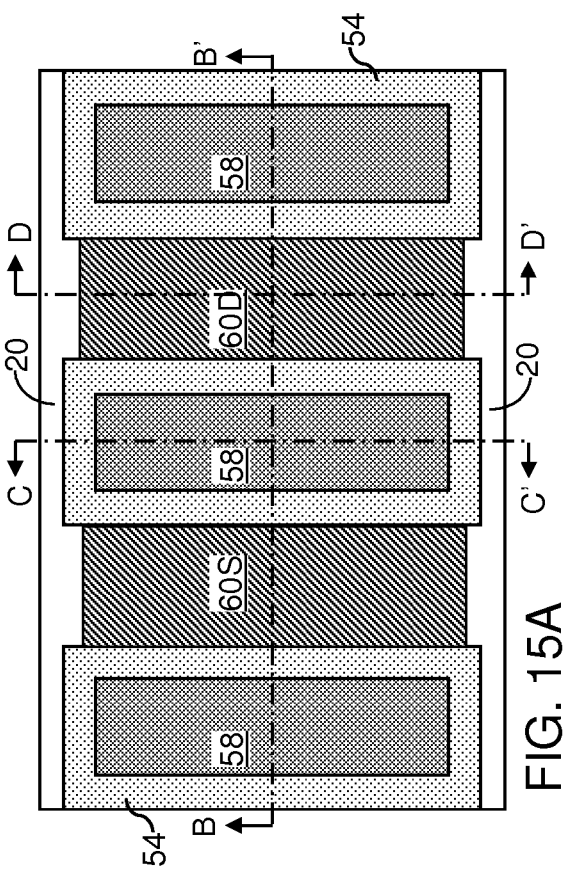
FIG. 15A is a top-down view of a variation of the second exemplary semiconductor structure after formation of a source region and a drain region by patterning the active semiconductor layer material according to the second embodiment of the present disclosure.
Figure 15B:
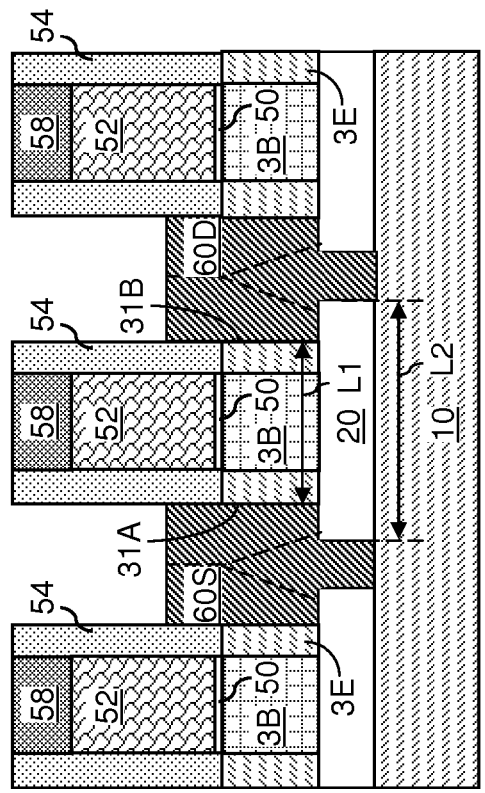
FIG. 15B is a vertical cross-sectional view of the second exemplary semiconductor structure along the vertical plane B-B' in FIG. 15A.

Referring to FIGS. 15A-15D, a photoresist layer is applied over the active semiconductor material layer 60L, and is lithographically patterned to cover areas in which at least one source region 60S and at least one drain region 60D are to be formed. The application and patterning of the photoresist layer can be performed in the same manner as in the processing steps of FIGS. 12A-12D. The deposited semiconductor material of the active semiconductor material layer 60L is patterned employing the photoresist layer as an etch mask. Portions of the top surface of the semiconductor material layer 10 can be physically exposed after patterning the deposited semiconductor material. Specifically, physically exposed portions of the active semiconductor material layer 60L can be removed by an anisotropic etch. A first remaining portion of the active semiconductor material layer 60L contacting the first end wall 31A is a source region 60S, and a remaining portion of the active semiconductor material layer 60L contacting the second end wall 31B is a drain region 60D. The photoresist layer can be subsequently removed, for example, by ashing.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor material layer located in a substrate;
   an insulator layer contacting a top surface of said semiconductor material layer and including a first opening and a second opening therein;
   a semiconductor fin contacting a top surface of said insulator layer;
   a gate stack contacting a top surface and sidewalls of said semiconductor fin;
   a source region filling said first opening, contacting a first portion of said top surface of said semiconductor material layer, and contacting a first end wall of said semiconductor fin that adjoins said sidewalls of said semiconductor fin; and
   a drain region filling said second opening, contacting a second portion of said top surface of said semiconductor material layer, and contacting a second end wall of said semiconductor fin that adjoins said sidewalls of said semiconductor fin,
   wherein a least lateral distance between said first portion of said top surface and said second portion of said top surface is greater than a lateral distance between said first end wall and said second end wall, and
   wherein a sidewall of said first opening adjoins said top surface of said insulator layer at a periphery that is laterally offset from said first end wall, and a sidewall of said second opening adjoins said top surface of said insulator layer at another periphery that is laterally offset from said second end wall.

2. The semiconductor structure of claim 1, further comprising a gate spacer laterally surrounding said gate stack, wherein said first end wall of said semiconductor fin is vertically coincident with a first outer sidewall of said gate spacer, and said second end wall of said semiconductor fin is vertically coincident with a second outer sidewall of said gate spacer.

3. The semiconductor structure of claim 1, wherein each of said semiconductor fin and said semiconductor material layer is single crystalline, and each of said source region and said drain region includes a portion that is epitaxially aligned to said semiconductor material layer and another portion that is epitaxially aligned to said semiconductor fin.

4. The semiconductor structure of claim 1, wherein a minimum lateral distance between said periphery and said first end wall is the same as a minimum lateral distance between said another periphery and said second end wall.

5. The semiconductor structure of claim 1, wherein said first opening and said second opening have substantially vertical sidewalls.

6. The semiconductor structure of claim 1, wherein said semiconductor fin comprises a body region, a source extension region including said first end wall and contacting said body region, and a drain extension region including said second end wall and contacting said body region and laterally spaced from said source region.

7. The semiconductor structure of claim 6, wherein said source extension region, said drain extension region, said source region, and said drain region have a same type of doping.

8. The semiconductor structure of claim 1, wherein each of said first opening and said second opening have a tapered surface extending from a top surface of said insulator layer to an interface between said insulator layer and said semiconductor material layer.

9. The semiconductor structure of claim 8, wherein a top edge of said first opening adjoins said first end wall, and a top edge of said second opening adjoins said second end wall.

* * * * *